(12) United States Patent
Kishima

(10) Patent No.: US 7,671,323 B2
(45) Date of Patent: Mar. 2, 2010

(54) SEMICONDUCTOR APPARATUS AND LIGHT DETECTION METHOD

(75) Inventor: Koichiro Kishima, Kanagawa (JP)

(73) Assignee: Sony Corporation, Tokyo (JP)

( * ) Notice: Subject to any disclaimer, the term of this patent is extended or adjusted under 35 U.S.C. 154(b) by 170 days.

(21) Appl. No.: 11/860,205

(22) Filed: Sep. 24, 2007

(65) Prior Publication Data

US 2008/0073489 A1    Mar. 27, 2008

(30) Foreign Application Priority Data

Oct. 6, 2006    (JP) .............................. 2006-274751

(51) Int. Cl.
  *G01J 1/04* (2006.01)
  *H01L 31/00* (2006.01)
  *G02B 6/26* (2006.01)
(52) U.S. Cl. .............................. 250/227.11; 250/214.1; 385/32
(58) Field of Classification Search .............. 250/214.1, 250/214 R, 227.2, 227.24, 227.11, 227.28; 257/82–84, 431–432, 116, 259, 292; 348/273, 348/302; 385/9, 12, 14, 32
  See application file for complete search history.

(56) References Cited

U.S. PATENT DOCUMENTS

| 4,438,447 A * | 3/1984 | Copeland et al. .............. 257/82 |
| 5,747,860 A * | 5/1998 | Sugiyama et al. ........... 257/432 |
| 2003/0067547 A1* | 4/2003 | Morris et al. ............... 348/273 |

OTHER PUBLICATIONS

Nikkei Electronics; Jun. 6, 2005 issue, p. 59-70.

* cited by examiner

*Primary Examiner*—Georgia Y Epps
*Assistant Examiner*—Don Williams
(74) *Attorney, Agent, or Firm*—Sonnenschein Nath & Rosenthal LLP

(57) ABSTRACT

A semiconductor apparatus includes an optical waveguide provided within a semiconductor region and above an insulating layer, and a plurality of photodetectors provided at the optical waveguide. The plurality of photodetectors includes insulated-gate field-effect transistors. The photodetectors capture data at different timings.

6 Claims, 8 Drawing Sheets

DATA DETECTED BY COMPARING OUTPUTS OF PHOTODETECTORS 31A AND 31B

SEMICONDUCTOR APPARATUS AND LIGHT DETECTION METHOD

CROSS REFERENCES TO RELATED APPLICATIONS

The present invention contains subject matter related to Japanese Patent Application JP 2006-274751 filed in the Japanese Patent Office on Oct. 6, 2006, the entire contents of which are incorporated herein by reference.

BACKGROUND OF THE INVENTION

1. Field of the Invention

The present invention relates to semiconductor apparatuses that can readily detect light of high frequency, and to light detection methods.

2. Description of the Related Art

In related art, a photodetector determines the presence of light by accumulating carriers produced by two photon absorption (TPA) in a body of a metal-oxide-semiconductor (MOS) transistor and detecting the accumulated amount. In such a photodetector, the light detection is basically implemented by switching the device among three modes, which are a data-deleting mode, data-capturing mode, and data-detecting mode (refer to Tetsuo Nozawa, "Kyoutainai ni shintou hajimeru hikari-densou-ruuta ya keitai-denwaki ga senkou", Nikkei Electronics, pages 59 to 70 and FIG. 11, Jun. 6, 2005). For this reason, if the frequency of a light signal to be detected is higher than a repeating cycle of these modes of the device, there is a high risk of an occurrence of deficiency of data.

SUMMARY OF THE INVENTION

As described above, the problem existing in the related art is that when the frequency of a light signal to be detected is higher than a repeating cycle of three modes of a device, which are a data-deleting mode, data-capturing mode, and data-detecting mode, a deficiency of data, for example, can occur.

It is desirable to achieve the capability to detect a light signal having a frequency that is higher than a repeating cycle of three modes of a device, namely, a data-deleting mode, data-capturing mode, and data-detecting mode.

According to an embodiment of the present invention, there is provided a semiconductor apparatus that includes an optical waveguide provided within a semiconductor region and above an insulating layer, and a plurality of photodetectors provided above the optical waveguide in the semiconductor region. The plurality of photodetectors includes insulated-gate field-effect transistors, and the photodetectors capture data at different timings.

Accordingly, the semiconductor apparatus is equipped with the plurality of photodetectors, and the photodetectors capture data at different timings. By comparing the outputs from the photodetectors to determine whether there is a time difference in the timings at which the data is captured, detection of light propagating through the optical waveguide can be implemented.

According to another embodiment of the present invention, there is provided a light detection method that is performed using a semiconductor apparatus that includes an optical waveguide provided within a semiconductor region and above an insulating layer, and a plurality of photodetectors provided above the optical waveguide in the semiconductor region, the plurality of photodetectors including insulated-gate field-effect transistors. The method includes the steps of switching each photodetector among three modes in a sequential manner, the three modes including a data-deleting mode, a data-capturing mode, and a data-detecting mode; and detecting light propagating through the optical waveguide by allowing the photodetectors to capture data at different timings in the data-capturing mode and comparing outputs of the photodetectors so as to detect the light on the basis of whether a time difference in the timings at which the data is captured exists.

In the light detection method, the photodetectors capture data at different timings, and the outputs from the photodetectors are compared to determine whether there is a time difference in the timings at which the data is captured. Based on the determination of the time difference in the timings, detection of light propagating through the optical waveguide is implemented. Thus, a light signal having a frequency that is higher than a repeating cycle of the aforementioned three modes of a device can be advantageously detected, which is not possible in the related art.

Accordingly, in contrast to the related art, the semiconductor apparatus according to the embodiment of the present invention has the capability to detect a light signal having a frequency that is higher than a repeating cycle of the aforementioned three modes of a device, thereby advantageously achieving higher-speed light propagation in, for example, optical communication.

Similarly, in contrast to the related art, the light detection method according to the embodiment of the present invention allows for detection of a light signal having a frequency that is higher than a repeating cycle of the aforementioned three modes of a device, thereby advantageously achieving higher-speed light propagation in, for example, optical communication.

DESCRIPTION OF THE PREFERRED EMBODIMENTS

Figure 1:
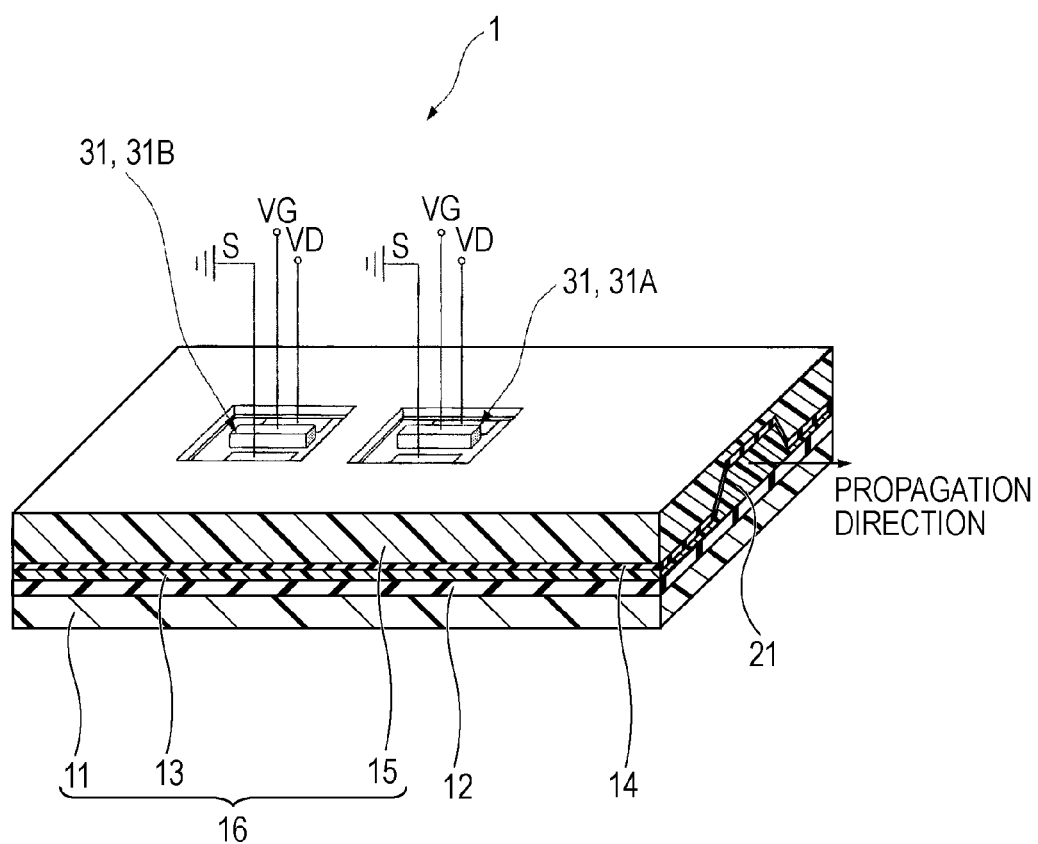
FIG. 1 is a schematic perspective view of a semiconductor apparatus according to a first embodiment of the present invention.
Figure 2:
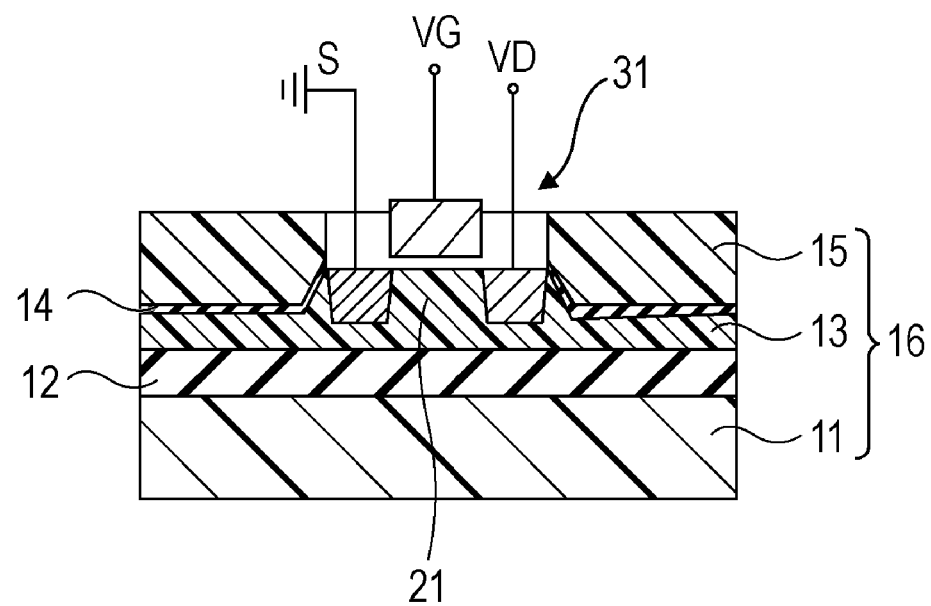
FIG. 2 is a cross-sectional view of the semiconductor apparatus according to the first embodiment of the present invention, as viewed in a gate length direction of a photodetector.
Figure 3:
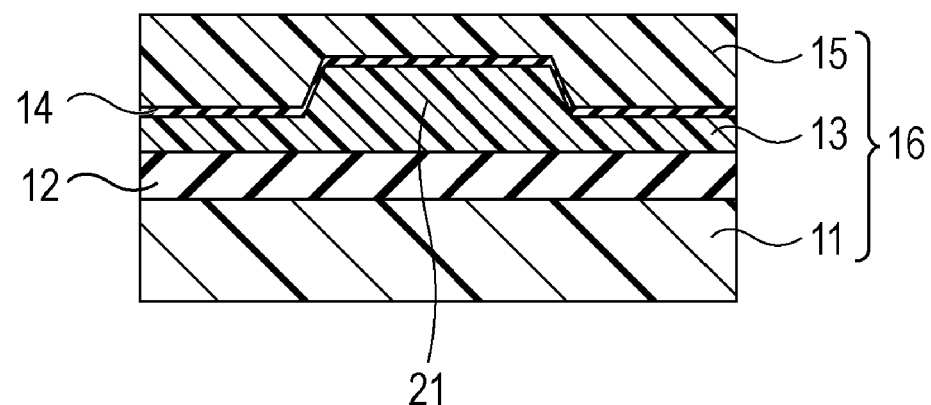
FIG. 3 is a cross-sectional view of an optical waveguide included in the semiconductor apparatus according to the first embodiment of the present invention.

A semiconductor apparatus 1 according to a first embodiment of the present invention will now be described with reference to FIGS. 1, 2, and 3. FIG. 1 is a schematic perspective view of the semiconductor apparatus 1. FIG. 2 is a cross-sectional view as viewed in a gate length direction of a photodetector. FIG. 3 is a cross-sectional view of an optical waveguide.

Referring to FIGS. 1 to 3, the semiconductor apparatus 1 includes a semiconductor substrate 11, a first insulating layer 12 disposed on the semiconductor substrate 11, a first semiconductor layer 13 disposed on the first insulating layer 12 and having a first area serving as an optical waveguide 21 and a second area, a second insulating layer 14 disposed on the first semiconductor layer 13, and a second semiconductor layer 15 disposed on the second insulating layer 14. Specifically, the first area of the first semiconductor layer 13 is given a thickness that is greater than that of the second area. The semiconductor substrate 11 is, for example, a silicon substrate. The first insulating layer 12 and the second insulating layer 14 are composed of a material that can trap light in the first semiconductor layer 13 interposed therebetween so that the light can be propagated through the first semiconductor layer 13. An example of such a material is a silicon oxide film. The first insulating layer 12 has a flat surface at the side adjacent to the first semiconductor layer 13. The second insulating layer 14 is partially depressed towards the second semiconductor layer 15 so that the first area serving as the optical waveguide 21 of the first semiconductor layer 13 can be given a large thickness. The first semiconductor layer 13 and the second semiconductor layer 15 are both silicon layers.

Although not shown in the drawings, as an alternative to the above configuration of the first insulating layer 12, the first semiconductor layer 13, and the second insulating layer 14, the first insulating layer 12 may be depressed towards the semiconductor substrate 11 so that the first area serving as the optical waveguide 21 of the first semiconductor layer 13 is given a large thickness. In that case, the second insulating layer 14 may have a flat surface at the side adjacent to the first semiconductor layer 13.

Specifically, the semiconductor substrate 11, the first semiconductor layer 13, and the second semiconductor layer 15 constitute a semiconductor region 16. The first semiconductor layer 13 and the second semiconductor layer 15 are first formed into a single semiconductor layer, and the second insulating layer 14 composed of silicon oxide is subsequently formed by oxygen ion implantation using, for example, a separation-by-implanted-oxygen (SIMOX) technique. The optical waveguide 21 is a ridge-type optical waveguide.

The semiconductor region 16 (i.e. the second semiconductor layer 15) above the optical waveguide 21 is provided with a plurality of photodetectors 31, namely, photodetectors 31A and 31B. Although two photodetectors 31A and 31B are provided in the first embodiment, three photodetectors 31 may be provided, as will be described hereinafter in a second embodiment of the present invention, or four or more photodetectors 31 may be provided. Increasing the number of photodetectors 31 can enhance the resolution. The photodetectors 31A and 31B are defined by insulated-gate field-effect transistors, such as negative-positive-negative (npn) metal-insulator-semiconductor (MIS) transistors. The insulated-gate field-effect transistors are provided such that the gate length direction thereof is orthogonal to a propagation direction of light through the optical waveguide 21 indicated by an arrow. Each insulated-gate field-effect transistor has a gate that receives a gate voltage VG, a drain that receives a drain voltage VD, and a source connected to ground.

Light detection by the photodetectors 31 depends on the amount of holes where the bodies of the insulated-gate field-effect transistors constituting the photodetectors 31 remain.

Therefore, in the first semiconductor layer 13 where the optical waveguide 21 is formed, there is preferably a difference between electron mobility and hole mobility. For example, the difference is such that the electron mobility is preferably about twice the hole mobility or more. For example, if the density is $1\times10^{18}$ atoms/cm$^3$, the electron mobility is 252 cm$^2$/V·s and the hole mobility is 178 cm$^2$/V·s. In this case, the electron mobility is about 1.5 times the hole mobility. This density is permissible since light detection is possible at this density. If the density is $1\times10^{17}$ atoms/cm$^3$, the electron mobility is 675 cm$^2$/V·s and the hole mobility is 331.5 cm$^2$/V·s. In this case, the electron mobility is about twice the hole mobility or more. Accordingly, the density is preferably set to $1\times10^{17}$ atoms/cm$^3$ or lower. Furthermore, it is preferable that a propagation loss of light be a low value, for example, a loss of about 1 dB/cm to 2 dB/cm. In view of these points, the density is set to $10^{12}$ atoms/cm$^3$ in the first embodiment. On the other hand, if the density is $1\times10^{18}$ atoms/cm$^3$ or higher, the difference between electron mobility and hole mobility becomes small. If the density is $2\times10^{20}$ atoms/cm$^3$, the electron mobility is 52.0 cm$^2$/V·s and the hole mobility is 50.8 cm$^2$/V·s. In this case, there is hardly any difference between electron mobility and hole mobility. In this state, light detection is difficult.

Reducing the gate length of the insulated-gate field-effect transistor constituting each photodetector 31 increases the speed of response. Moreover, reducing the area of each photodetector 31 increases the carrier density of carriers passing through the photodetector 31, thereby allowing for higher detectability.

The semiconductor apparatus 1 is equipped with the plurality of photodetectors 31, and the photodetectors 31 capture data at different timings. Consequently, by comparing the outputs from the photodetectors 31 to determine whether there is a time difference in the timings at which the data is captured, detection of light propagating through the optical waveguide 21 can be implemented. More specifically, the semiconductor apparatus 1 accumulates carriers produced by two-photon absorption (TPA) in the bodies of the insulated-gate field-effect transistors of the photodetectors 31, and detects the accumulated amounts to determine the presence of light. Accordingly, in contrast to the related art, the semiconductor apparatus 1 achieves the capability to detect a light signal having a frequency that is higher than the repeating cycle of three modes of a detection device, namely, a data-deleting mode, data-capturing mode, and data-detecting mode, thereby advantageously achieving higher-speed light propagation in, for example, optical communication.

A light detection method according to the first embodiment of the present invention will now be described with reference to timing charts shown in FIGS. 4 to 6. First, a data detection method employed in a case where the frequency of data to be detected is shorter than the data-capturing timing in the three modes of each detection device, i.e. the data-deleting mode, data-capturing mode, and data-detecting mode, will be described.

Figure 4:
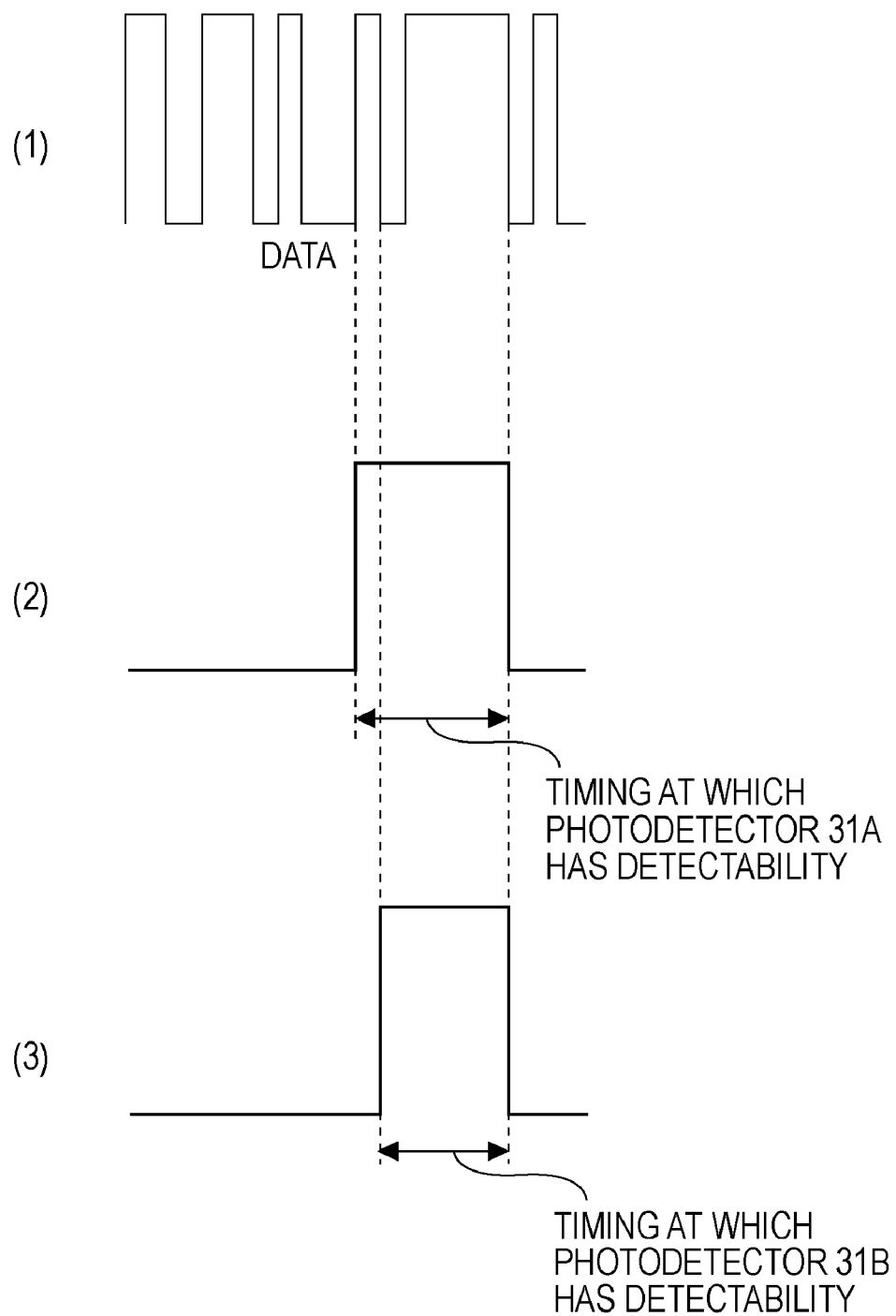
FIG. 4 is a timing chart showing a light detection method according to the first embodiment of the present invention.
Figure 5:
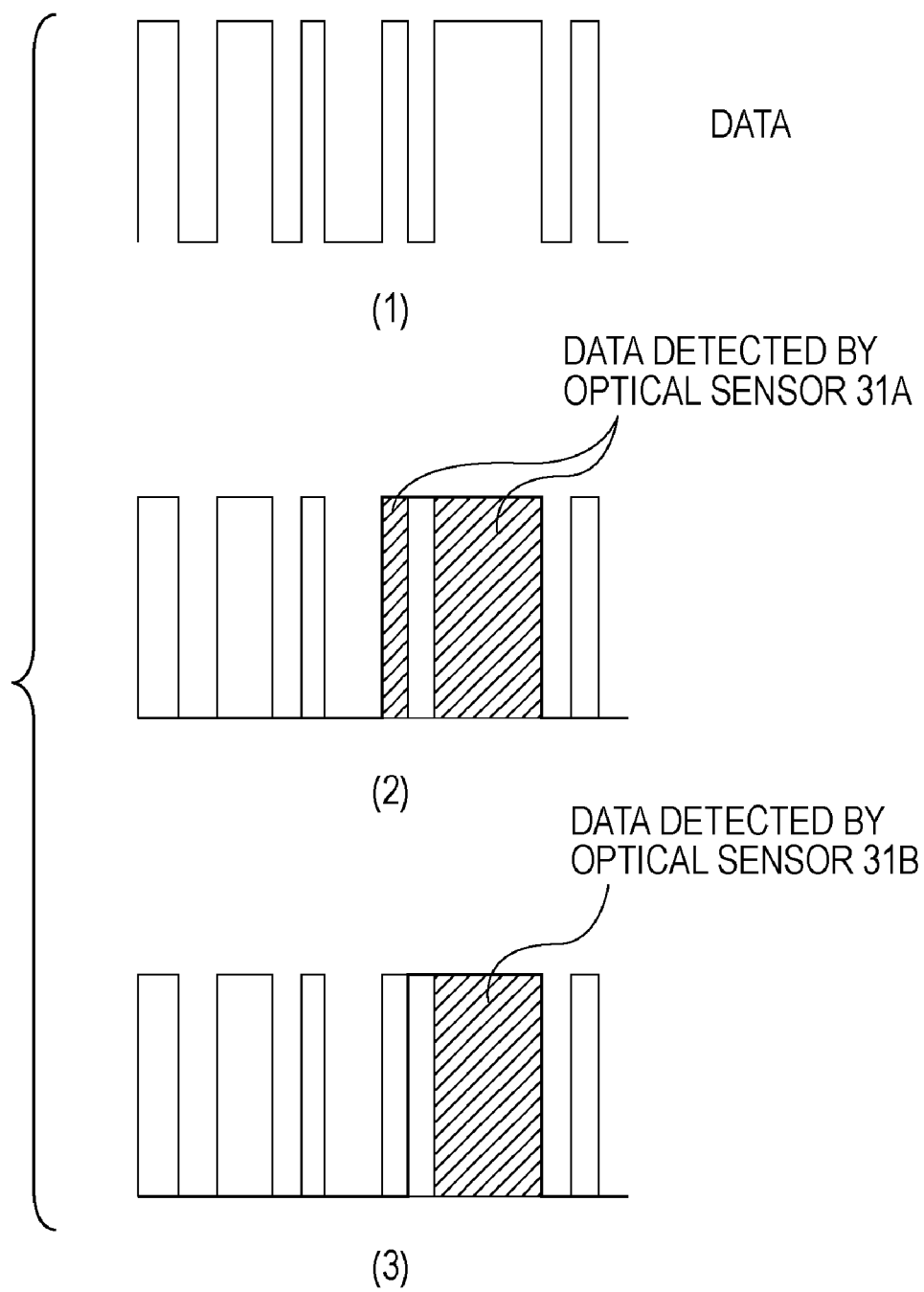
FIG. 5 is another timing chart showing the light detection method according to the first embodiment of the present invention.

In the first embodiment, with respect to data shown in part (1) of FIG. 4, a timing at which the photodetector (31) 31A has detectability shown in part (2) of FIG. 4 and a timing at which the photodetector 31 (31B) has detectability shown in part (3) of FIG. 4 are varied relative to each other so that a signal that is shorter than a data-capturing timing can be received. Specifically, referring to FIG. 5, since the data-capturing timings of the photodetector 31 (31A) and the photodetector 31 (31B), namely, the timings with detectability, are set differently, data to be captured by the photodetector 31 (31A) and the photodetector 31 (31B) can be different from each other. For example, with respect to data shown in part (1) of FIG. 5, the photodetector 31 (31A) detects data indicated by shaded sections shown in part (2) of FIG. 5. On the other hand, the photodetector 31 (31B) detects data indicated by a shaded section shown in part (3) of FIG. 5.

Figure 6:
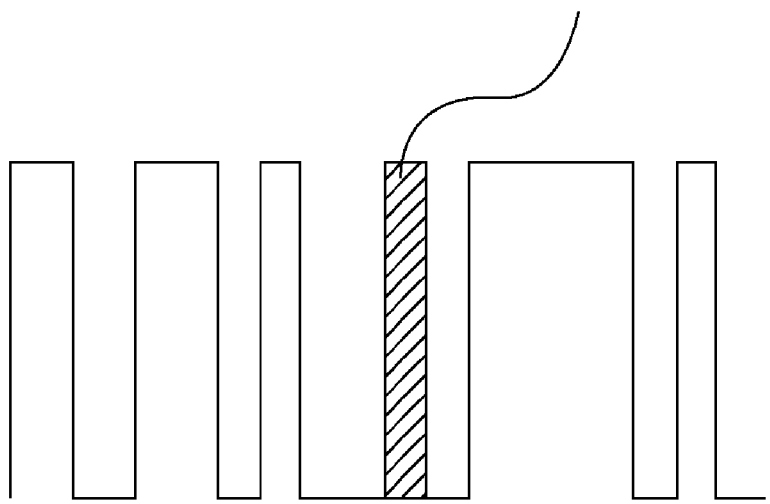
FIG. 6 is another timing chart showing the light detection method according to the first embodiment of the present invention.

Accordingly, referring to FIG. 6, by comparing the outputs of the photodetector 31 (31A) and the photodetector 31 (31B), it can be confirmed that data exists in the shaded section corresponding to the time difference in the data-capturing timings of the photodetector 31 (31A) and the photodetector 31 (31B).

Although not shown, if there is no difference in the outputs of the photodetector 31 (31A) and the photodetector 31 (31B), it can be confirmed that data does not exist in the section corresponding to the time difference in the data-capturing timings of the photodetector 31 (31A) and the photodetector 31 (31B).

Figure 7:
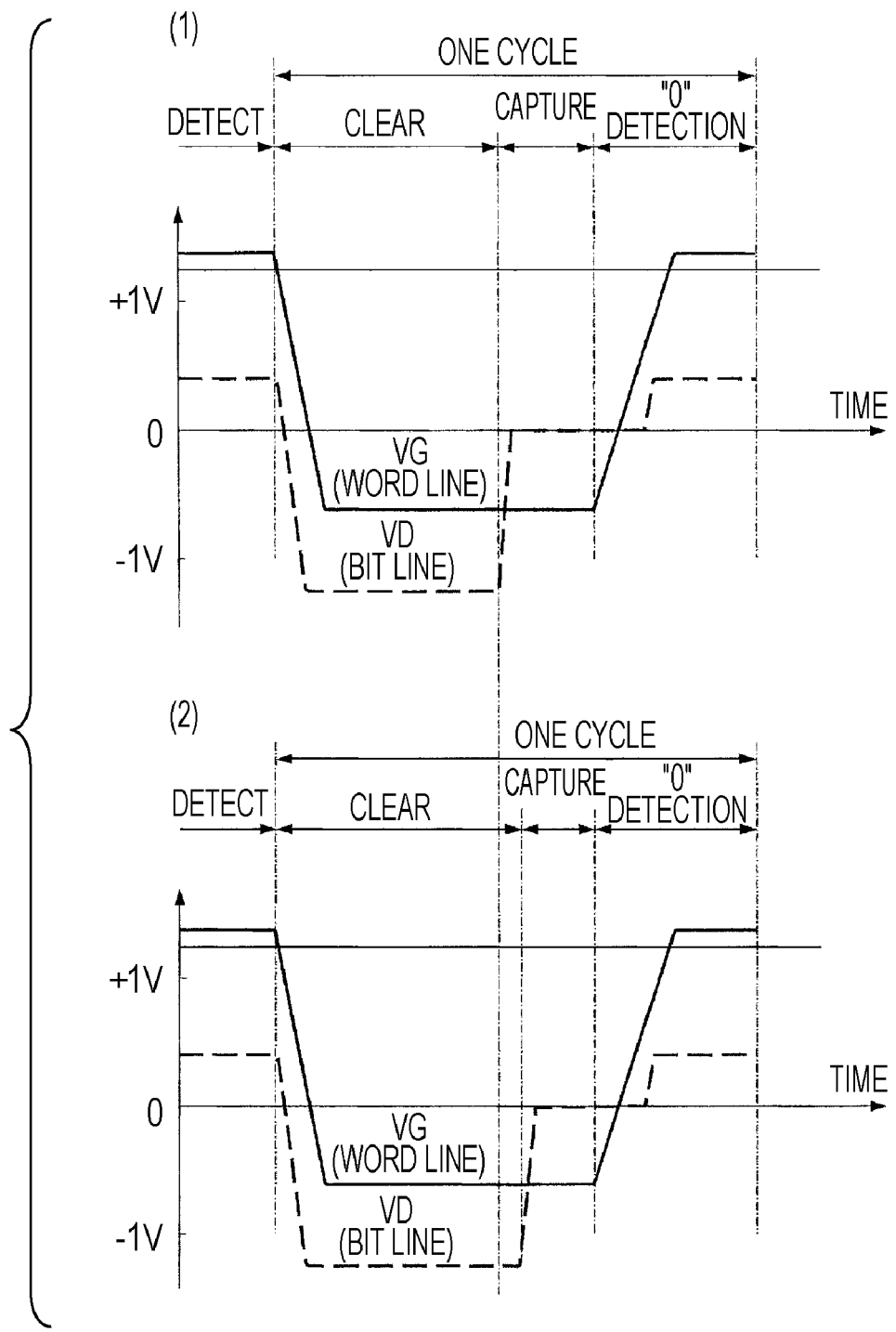
FIG. 7 is a timing chart showing waveforms of voltages input to terminals of photodetectors.

Examples of waveforms of voltages input to the terminals of the photodetector 31 (31A) and the photodetector 31 (31B) will be described below with reference to a timing chart shown in FIG. 7. FIG. 7 includes part (1) showing a drive waveform of the photodetector 31 (31A), and part (2) showing a drive waveform of the photodetector 31 (31B), and illustrates a specific example in which the data-capturing timings are varied. In FIG. 7, "VG" denotes a gate voltage, and "VD" denotes a drain voltage.

As shown in FIG. 7, the operation of each of the photodetector 31 (31A) and the photodetector 31 (31B) includes three steps, which are a clearing step, capturing step, and detecting step. Each photodetector 31 has the potential to have an operating frequency that is higher than or equal to a value that is less than a response frequency thereof by a single digit. Consequently, if the insulated-gate field-effect transistors constituting the photodetectors 31 have operating frequency performance of about 10 GHz, an operating frequency in the GHz level is possible.

Figure 8:
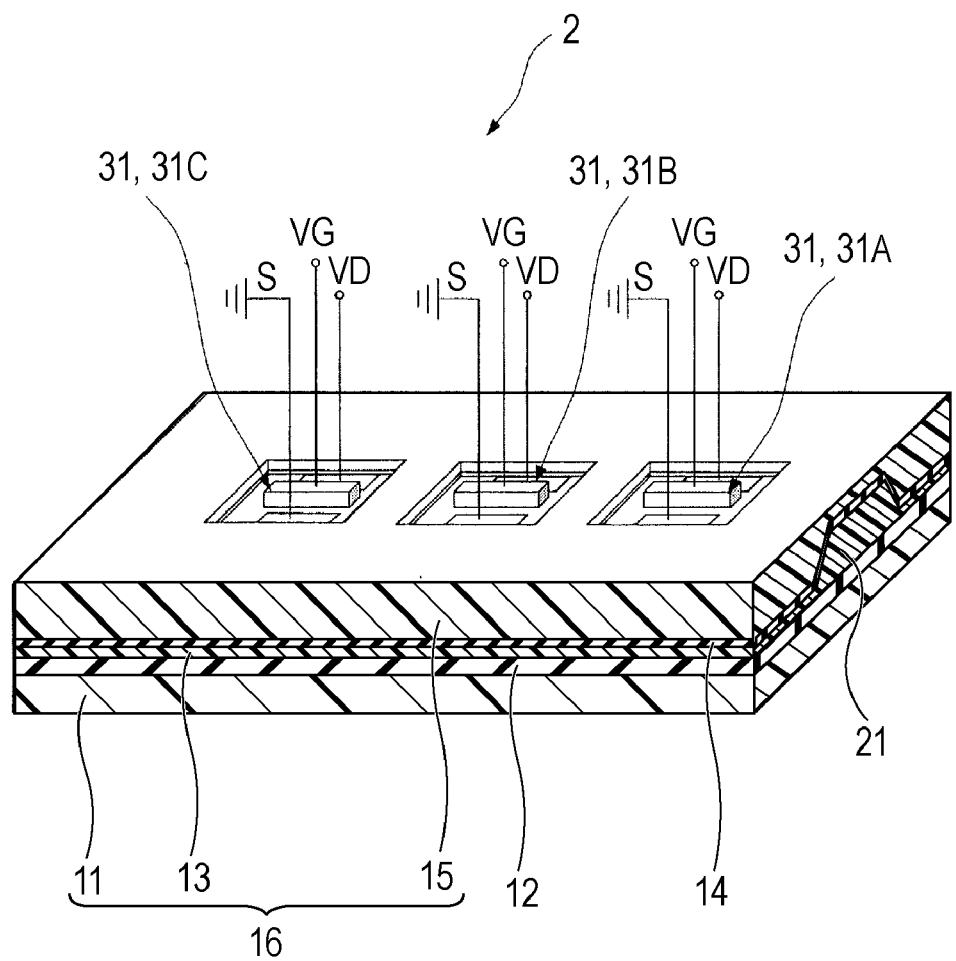
FIG. 8 is a schematic perspective view of a semiconductor apparatus according to a second embodiment of the present invention.
Figure 9:
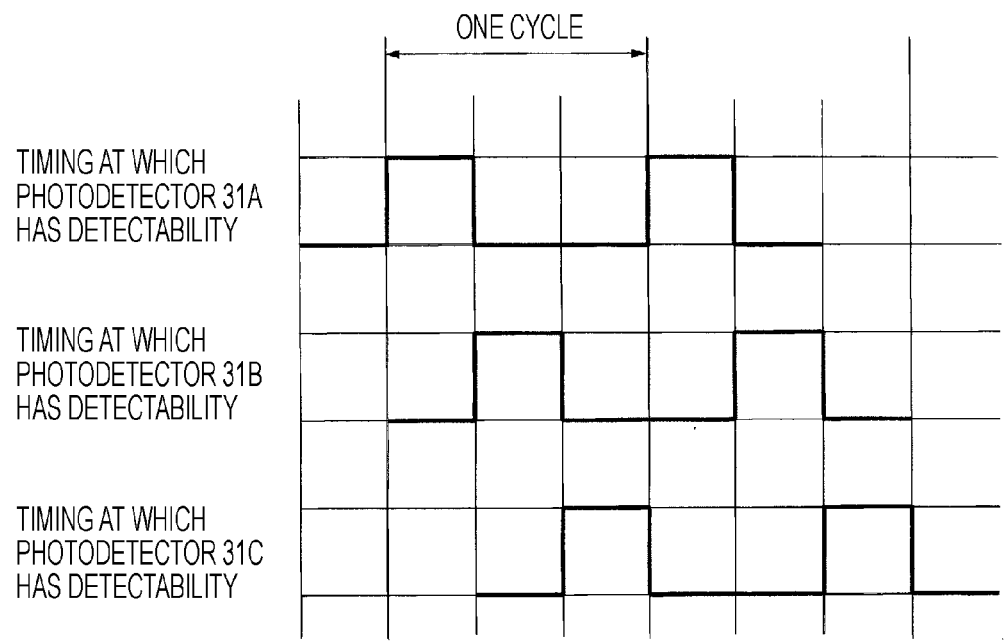
FIG. 9 is a timing chart showing a light detection method according to the second embodiment of the present invention.

A semiconductor apparatus 2 according to a second embodiment of the present invention will now be described with reference to FIGS. 8 and 9. FIG. 8 is a schematic perspective view of the semiconductor apparatus 2, and FIG. 9 is a timing chart.

In the second embodiment, a data detection method employed in a case where the frequency of data to be detected is somewhat shorter than a time period of one cycle including three modes of each photodetector, i.e. the data-deleting mode, data-capturing mode, and data-detecting mode, will be described.

Referring to FIG. 8, the semiconductor apparatus 2 includes a semiconductor substrate 11, a first insulating layer 12 disposed on the semiconductor substrate 11, a first semiconductor layer 13 disposed on the first insulating layer 12 and having a first area serving as an optical waveguide 21 and a second area, a second insulating layer 14 disposed on the first semiconductor layer 13, and a second semiconductor layer 15 disposed on the second insulating layer 14. Specifically, the first area of the first semiconductor layer 13 is given a thickness that is greater than that of the second area. The semiconductor substrate 11 is, for example, a silicon substrate. The first insulating layer 12 and the second insulating layer 14 are composed of a material that can trap light in the first semiconductor layer 13 interposed therebetween so that the light can be propagated through the first semiconductor layer 13. An example of such a material is a silicon oxide film. The first insulating layer 12 has a flat surface at the side adjacent to the first semiconductor layer 13. The second insulating layer 14 is partially depressed towards the second semiconductor layer 15 so that the first area serving as the optical waveguide 21 of the first semiconductor layer 13 can be given a large thickness. The first semiconductor layer 13 and the second semiconductor layer 15 are both silicon layers.

Although not shown in the drawings, as an alternative to the above configuration of the first insulating layer 12, the first semiconductor layer 13, and the second insulating layer 14, the first insulating layer 12 may be depressed towards the semiconductor substrate 11 so that the first area serving as the optical waveguide 21 of the first semiconductor layer 13 is given a large thickness. In that case, the second insulating layer 14 may have a flat surface at the side adjacent to the first semiconductor layer 13.

Specifically, the semiconductor substrate 11, the first semiconductor layer 13, and the second semiconductor layer 15 constitute a semiconductor region 16. The first semiconductor layer 13 and the second semiconductor layer 15 are first formed into a single semiconductor layer, and the second insulating layer 14 composed of silicon oxide is subsequently formed by oxygen ion implantation using, for example, a SIMOX technique. The optical waveguide 21 is a ridge-type optical waveguide.

The semiconductor region 16 (i.e. the second semiconductor layer 15) above the optical waveguide 21 is provided with a plurality of photodetectors 31, namely, photodetectors 31A, 31B, and 31C. The photodetectors 31A, 31B, and 31C are defined by insulated-gate field-effect transistors, such as npn MIS transistors. The insulated-gate field-effect transistors are provided such that the gate length direction thereof is orthogonal to a propagation direction of light through the optical waveguide 21 indicated by an arrow. Each insulated-gate field-effect transistor has a gate that receives a gate voltage VG, a drain that receives a drain voltage VD, and a source connected to ground.

The semiconductor apparatus 2 is equipped with the plurality of (three) photodetectors 31, and the photodetectors 31 capture data at different timings. Consequently, by comparing the outputs from the photodetectors 31 to determine whether there are time differences in the timings at which the data is captured, detection of light propagating through the optical waveguide 21 can be implemented. More specifically, the semiconductor apparatus 2 accumulates carriers produced by two-photon absorption (TPA) in the bodies of the insulated-gate field-effect transistors of the photodetectors 31, and detects the accumulated amounts to determine the presence of light. Accordingly, in contrast to the related art, the semiconductor apparatus 2 achieves the capability to detect a light signal having a frequency that is higher than the repeating cycle of three modes of a detection device, namely, a data-deleting mode, data-capturing mode, and data-detecting mode, thereby advantageously achieving higher-speed light propagation in, for example, optical communication.

A light detection method according to the second embodiment of the present invention will now be described with reference to the timing chart shown in FIG. 9.

Referring to FIG. 9, in the second embodiment, the photodetectors 31A, 31B, and 31C together have detectability over an entire period of one cycle. In this example, each photodetector 31 has detectability over one-third of one cycle. Specifically, the photodetector 31 (31A), the photodetector 31 (31B), and the photodetector 31 (31C) capture data at different timings, that is, have different detectable timings, whereby data to be captured by the photodetector 31 (31A), the photodetector 31 (31B), and the photodetector 31 (31C) can be different from each other as in the first embodiment.

Accordingly, by comparing the outputs of the photodetector 31 (31A), the photodetector 31 (31B), and the photodetector 31 (31C), if there are differences in the outputs of the photodetector 31 (31A), the photodetector 31 (31B), and the photodetector 31 (31C), it can be confirmed that data exists in the sections corresponding to the time differences in the data-capturing timings.

On the other hand, if there are no differences in the outputs of the photodetector 31 (31A), the photodetector 31 (31B), and the photodetector 31 (31C), it can be confirmed that data does not exist in the sections corresponding to the time differences in the data-capturing timings of the photodetector 31 (31A), the photodetector 31 (31B), and the photodetector 31 (31C).

In addition, since the data-capturing timings of the photodetector 31 (31A), the photodetector 31 (31B), and the photodetector 31 (31C) cover the entire time period of one cycle in the second embodiment, data deficiencies can be prevented.

In the above embodiments of the present invention, each photodetector 31 may have a length of about 1 μm to 20 μm, and the photodetectors 31 may be separated from each other by a distance necessary for isolation to maintain the independency of signals. Such a distance may be several μm or less. Regarding the speed of propagation of light through the optical waveguide 21, assuming that the effective refractive index of the optical waveguide 21 is about 3, a distance of propagation based on $1 \times 10^{-9}$ sec=1 nsec, which is a signal clock of 1 GHz, is about 33 cm. Accordingly, the propagation time of light is negligible even if the devices are disposed in the above-described positions relative to the optical waveguide 21.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor apparatus comprising:
an optical waveguide formed within a semiconductor region and above an insulating layer; and
a plurality of photodetectors formed in the optical waveguide, wherein each of the plurality of photodetectors includes a respective insulated-gate field-effect transistor, and wherein the photodetectors are arranged along the optical waveguide in a propagation direction of light through the optical waveguide such that the photodetectors capture data corresponding to light propagated through the optical waveguide at different timings.

2. The semiconductor apparatus according to claim 1, wherein the insulated-gate field-effect transistors are formed in the semiconductor region to which an electric field of light propagating through the optical waveguide extends such that a source and a drain of each insulated-gate field-effect transistor extends into the optical waveguide.

3. The semiconductor apparatus according to claim 1, wherein the insulating layer includes a first insulating layer disposed on a semiconductor substrate,
wherein the semiconductor region includes a first semiconductor layer and a second semiconductor layer that are separated from each other by a second insulating layer, and
wherein the optical waveguide is defined by a thick region of the first semiconductor layer, the thick region of the first semiconductor layer being formed as a result of depressing the first insulating layer towards the semiconductor substrate or depressing the second insulating layer towards the second semiconductor layer.

4. The semiconductor apparatus according to claim 1, wherein the insulated-gate field-effect transistors are negative-channel metal-insulator-semiconductor transistors.

5. The semiconductor apparatus according to claim 1, wherein each of the insulated-gate field-effect transistors is provided such that a gate length direction thereof is orthogonal to a propagation direction of light through the optical waveguide.

6. A light detection method performed using a semiconductor apparatus that includes an optical waveguide formed within a semiconductor region and above an insulating layer; and a plurality of photodetectors formed in the optical waveguide in the semiconductor region, each of the plurality of photodetectors including a respective insulated-gate field-effect transistor, the photodetectors being arranged along the optical waveguide in a propagation direction of light through the optical waveguide, the method comprising the steps of:
switching each photodetector among three modes in a sequential manner, the three modes including a data-deleting mode, a data-capturing mode, and a data-detecting mode; and detecting light propagating through the optical waveguide by allowing the photodetectors to capture data at different timings in the data-capturing mode and comparing outputs of the photodetectors so as to detect the light on the basis of whether a time difference in the timings at which the data is captured exists.

* * * * *